(12) United States Patent
Lee et al.

(10) Patent No.: US 7,710,762 B2
(45) Date of Patent: May 4, 2010

(54) DEVICE FOR PROTECTING SRAM DATA

(75) Inventors: Bong Soo Lee, Daejeon (KR); Jong Mok Son, Daejeon (KR); Jong Ho Chae, Daejeon (KR); Sang Yi Yi, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 171 days.

(21) Appl. No.: 12/136,168

(22) Filed: Jun. 10, 2008

(65) Prior Publication Data

US 2009/0147613 A1  Jun. 11, 2009

(30) Foreign Application Priority Data

Dec. 10, 2007  (KR) .................. 10-2007-0127556

(51) Int. Cl.
*G11C 11/00* (2006.01)
(52) U.S. Cl. .................. 365/154; 365/198.09; 365/195; 365/226
(58) Field of Classification Search .................. 365/154, 365/189.09, 195, 226
See application file for complete search history.

(56) References Cited

U.S. PATENT DOCUMENTS 6,294,404 B1 *  9/2001  Sato ........................... 438/106

7,586,806 B2 *  9/2009  Wong ......................... 365/226

FOREIGN PATENT DOCUMENTS

KR  1020010004759  1/2001

* cited by examiner

*Primary Examiner*—Hoai V Ho
(74) *Attorney, Agent, or Firm*—Ladas & Parry LLP

(57) ABSTRACT

A device for protecting data stored in a static random access memory (SRAM) is provided. More particularly, a device for protecting SRAM data including an SRAM data erasing circuit, which erases memory stored in an SRAM at once when illegal separation from a system is detected. The device for protecting SRAM data includes: a power switching circuit for outputting electrical power supplied from an external power supply or a back-up battery power supply depending on whether the external power supply is supplying the electrical power or not; and an SRAM data erasing circuit for supplying the electrical power output from the power switching circuit to a power input terminal of a SRAM or grounding the power input terminal of the SRAM, in response to a connecter connection signal. The device can prevent illegal leakage of SRAM data by erasing the data stored in the SRAM when the SRAM is illegally separated from a system according to the switch setting of the SRAM data erasing circuit.

6 Claims, 4 Drawing Sheets

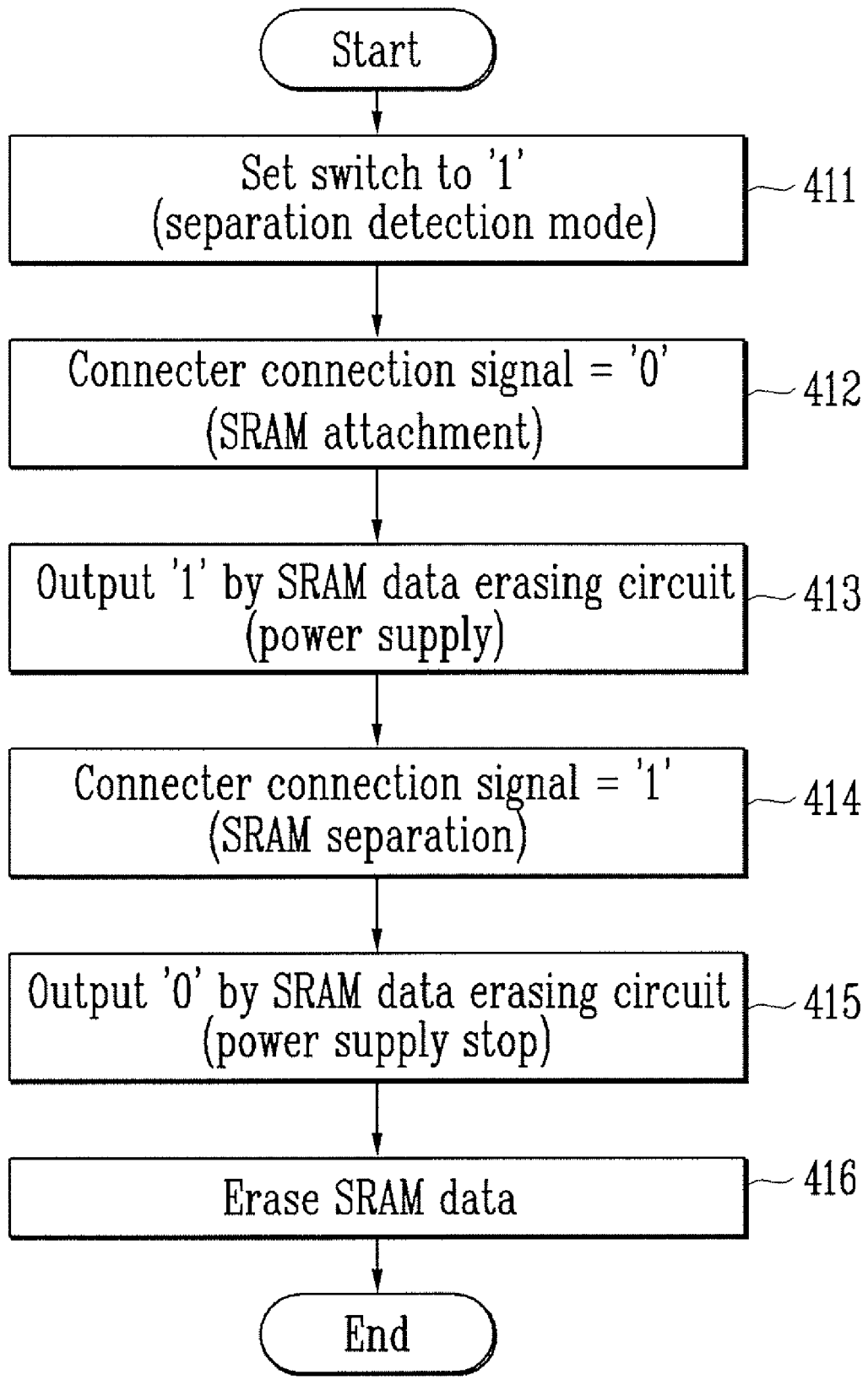

DEVICE FOR PROTECTING SRAM DATA

CROSS-REFERENCE TO RELATED APPLICATION

This application claims priority to and the benefit of Korean Patent Application No. 2007-127556, filed Dec. 10, 2007, the disclosure of which is incorporated herein by reference in its entirety.

BACKGROUND

1. Field of the Invention

The present invention relates to a device for protecting data stored in a static random access memory (SRAM), and more particularly, to a device for protecting SRAM data including an SRAM data erasing circuit, which erases memory stored in an SRAM at once when illegal separation from a system is detected.

2. Discussion of Related Art

An SRAM is a volatile memory that loses all stored data when power is not supplied due to general characteristics of a RAM. However, when storing important data in an SRAM, a user may protect the data by connecting a separate power switching circuit to the SRAM to continuously supply power.

FIG. 1 is a diagram illustrating an operation of a general power switching circuit.

Referring to FIG. 1, a processor 130 transmits a chip selection signal for reading and writing data from and to an SRAM 120 to a chip selection signal receiving terminal CS_IN of a power switching circuit 110. The power switching circuit 110 then transmits the chip selection signal to a chip selection signal input terminal CS of the SRAM 120 via a chip selection signal sending terminal CS_OUT. The SRAM 120 communicates data with a processor 130 in response to the chip selection signal.

A power input terminal VCC of the SRAM 120 receives electrical power from a power output terminal Vout of the power switching circuit 110. At this point, when an external power supply 140 supplies electrical power, the power switching circuit 110 supplies the electrical power from the external power supply 140 to the power input terminal VCC of the SRAM 120. However, when the external power supply 140 does not supply electrical power, the power switching circuit 110 supplies electrical power to the power input terminal VCC of the SRAM 120 using a back-up battery power supply 150. Accordingly, the power switching circuit 110 may continuously supply electrical power to the SRAM 120 even in circumstances where it is impossible for the external power supply 140 to supply electrical power, and thus the data stored in the SRAM 120 is protected.

Conventional devices for protecting SRAM data using such a power switching circuit can protect data stored in the SRAM by continuously supplying power irrespective of the state of the external power supply. However, when a user with malicious intent separates the attached SRAM from the system, confidential data stored in the SRAM remains in the SRAM after separation and can be accessed.

SUMMARY OF THE INVENTION

The present invention is directed to a device for protecting SRAM data which can prevent leakage of data stored in an SRAM when the SRAM is illegally separated from a system.

One aspect of the present invention provides a device for protecting SRAM data, including: a power switching circuit for outputting electrical power supplied from an external power supply or a back-up battery power supply depending on whether the external power supply is supplying the electrical power or not; and an SRAM data erasing circuit for supplying the electrical power output from the power switching circuit to a power input terminal of a SRAM or grounding the power input terminal of the SRAM, in response to a connecter connection signal.

BRIEF DESCRIPTION OF THE DRAWINGS

The above and other objects, features and advantages of the present invention will become more apparent to those of ordinary skill in the art by describing in detail preferred embodiments thereof with reference to the attached drawings in which:

FIGS. 4A and 4B are flowcharts illustrating operation processes of the SRAM data erasing circuit of FIG. 3.

DETAILED DESCRIPTION OF PREFERRED EMBODIMENTS

Hereinafter, an exemplary embodiment of the present invention will be described in detail. The present invention is not limited to the embodiment disclosed below, but can be implemented in various modified forms. The below embodiment is described in order to fully enable those of ordinary skill in the art to embody and practice the invention.

Figure 1:
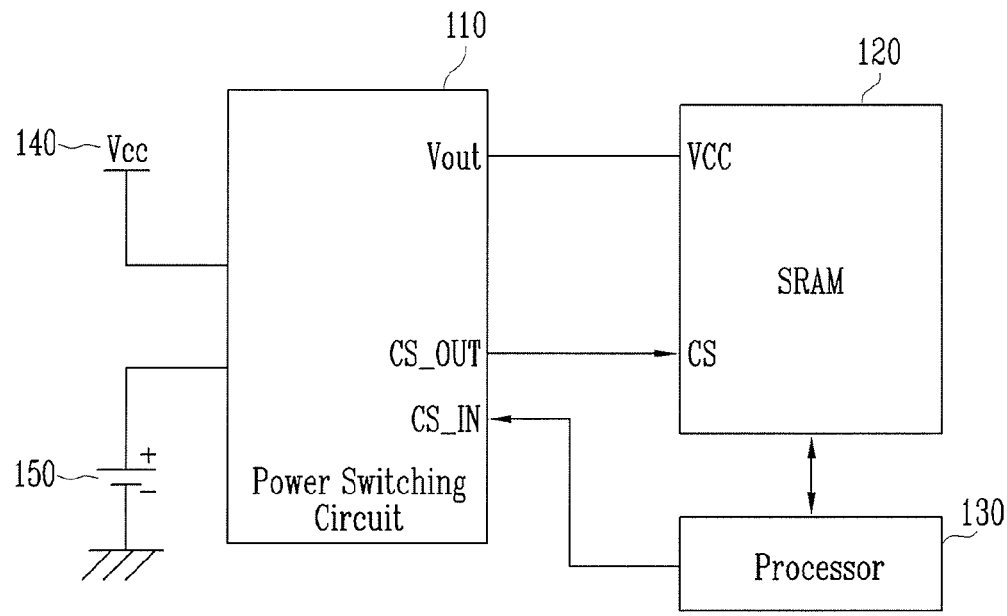
FIG. 1 is a diagram illustrating an operation of a general power switching circuit.
Figure 2:
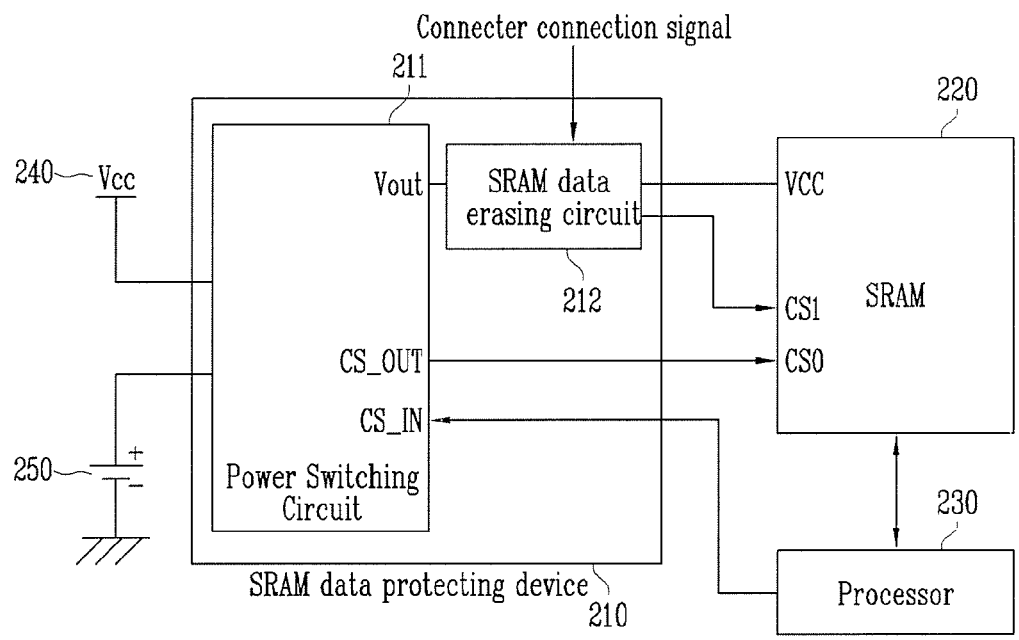
FIG. 2 is a block diagram illustrating a configuration of a SRAM data protecting device according to an exemplary embodiment of the present invention.

FIG. 2 is a block diagram illustrating a configuration of a device for protecting SRAM data according to an exemplary embodiment of the present invention.

Referring to FIG. 2, a SRAM data protecting device 210 according to an exemplary embodiment of the present invention includes a power switching circuit 211 and an SRAM data erasing circuit 212.

A processor 230 transmits a chip selection signal for reading and writing data from and to an SRAM 220 to a chip selection signal receiving terminal CS_IN of the power switching circuit 211. The power switching circuit 211 then transmits the chip selection signal to a first chip selection signal input terminal CS0 of the SRAM 220 via a chip selection signal output terminal CS_OUT. The SRAM 220 may communicate data with the processor 230 in response to the chip selection signal input to the first chip selection signal input terminal CS0.

Further, the power switching circuit 211 outputs electrical power supplied from an external power supply 240 or a back-up battery power supply 250 through a power output terminal Vout depending on whether the electrical power is supplied from the external power supply 240. For example, when the external power supply 240 supplies electrical power, the power switching circuit 211 outputs the electrical power supplied from the external power supply 240, but when the external power supply 240 does not supply electrical power, the power switching circuit 211 outputs electrical power supplied from the back-up battery power supply 250.

The SRAM data erasing circuit 212 receives the electrical power output from the power output terminal Vout of the power switching circuit 211, and supplies the electrical power to a power input terminal VCC of the SRAM 220 in response to a connecter connection signal. Here, the connecter connection signal is a signal indicating whether the SRAM 220 is physically attached to or separated from an SRAM connector, which connects the SRAM 220 to a system (e.g., a main board). The SRAM data erasing circuit 212 determines whether the SRAM is attached or separated in response to the connecter connection signal, and erases the data stored in the SRAM 220 by grounding the power input terminal VCC of the SRAM 220 when illegal separation is detected according to user settings.

In one embodiment, the SRAM data erasing circuit 212 may additionally output a second chip selection signal to a second chip selection signal input terminal CS1 of the SRAM 220 in response to the connecter connection signal. In this case, the SRAM 220 may communicate data with the processor 230 in response to the signals applied to the first and second chip selection signal input terminals CS0 and CS1. For example, when detecting illegal separation in response to the connecter connection signal, the SRAM data erasing circuit 212 may apply the second chip selection signal of '0', so as to disable the SRAM 220 from inputting/outputting data while erasing the SRAM data.

By the above configuration, the SRAM data protecting device of the present invention can prevent leakage of the data by erasing confidential data stored in the SRAM when a user with malicious intent separates the SRAM from the system while maintaining the data stored in the SRAM irrespective of the state of the external power supply.

Figure 3:
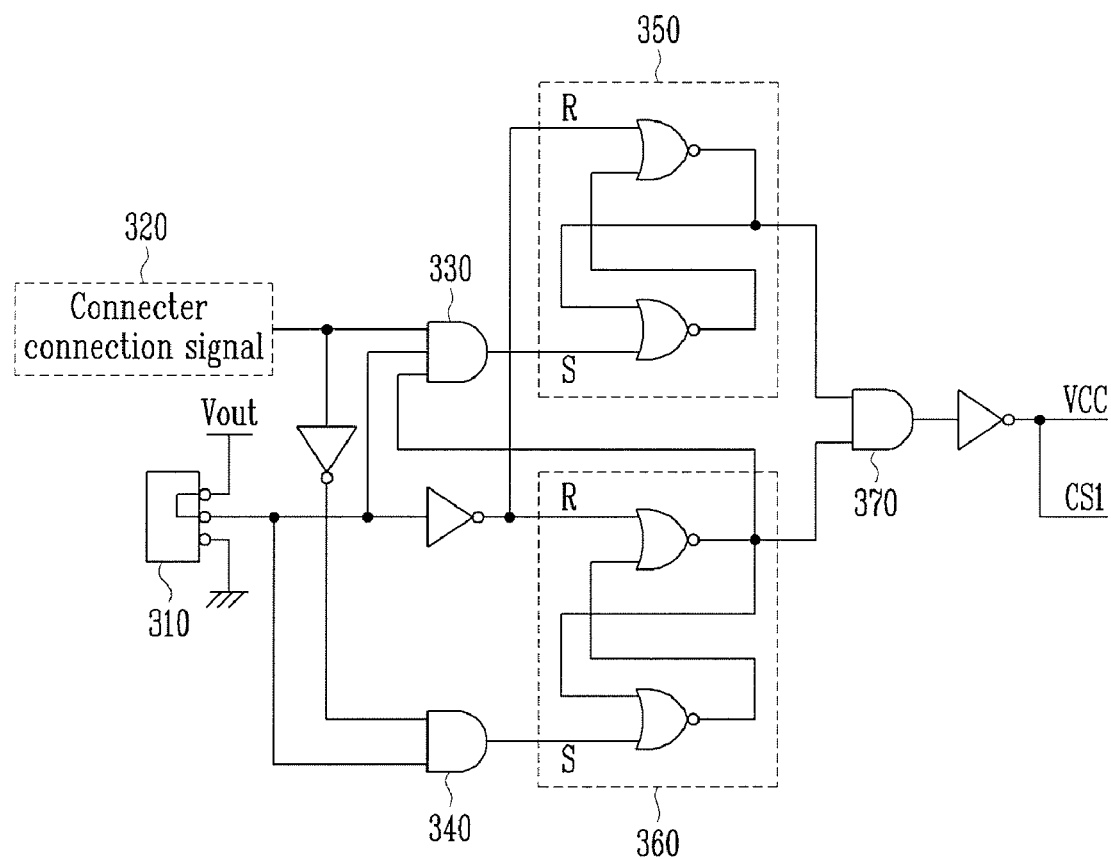
FIG. 3 is a diagram illustrating a configuration of an SRAM data erasing circuit included in a SRAM data protecting device according to an exemplary embodiment of the present invention.

FIG. 3 is a diagram illustrating a configuration of an SRAM data erasing circuit included in a SRAM data protecting device according to an exemplary embodiment of the present invention.

Referring to FIG. 3, an SRAM data erasing circuit includes a switch 310, a first RS latch 350, a second RS latch 360, a plurality of AND gates 330, 340 and 370, and a plurality of inverters.

The switch 310 selects a power output terminal Vout of a power switching circuit or a grounded terminal, according to a user's choice, to connect the selected terminal to an output terminal of the switch 310. Here, voltage of the power output terminal Vout of the power switching circuit corresponds to a logic device input/output value of '1', and voltage of the grounded terminal corresponds to a logic device input/output value of '0'. When the user sets the switch 310 to '0', the SRAM data erasing circuit operates in normal mode where the SRAM data is not erased due to separation of the SRAM. When the user sets the switch 310 to '1', the SRAM data erasing circuit operates in separation detection mode where separation of the SRAM is detected to erase the data in the SRAM. Operation of the SRAM data erasing circuit according to normal mode or separation detection mode will be described in detail with reference to FIGS. 4A and 4B below.

An output signal of the switch 310 is inverted and input to R input terminals of the first and second RS latches 350 and 360.

Further, the output signal of the switch 310, a connecter connection signal 320 and an output signal of the second RS latch 360 are input to a first AND gate 330, and an output signal of the first AND gate 330 is input to an S input terminal of the first RS latch 350. At this point, the connecter connection signal 320 becomes '0' when the SRAM is attached to an SRAM connector or becomes '1' when the SRAM is separated from the SRAM connector. The output signal of the switch 310 and the inverted connecter connection signal 320 are input to a second AND gate 340, and an output signal of the second AND gate 340 is input to an S input terminal of the second RS latch 360.

The output signal of the first and second RS latches 350 and 360 are input to a third AND gate 370, and an output signal of the third AND gate 370 is inverted and then input to a power input terminal VCC of the SRAM and a second chip selection signal input terminal CS1.

Figure 4A:
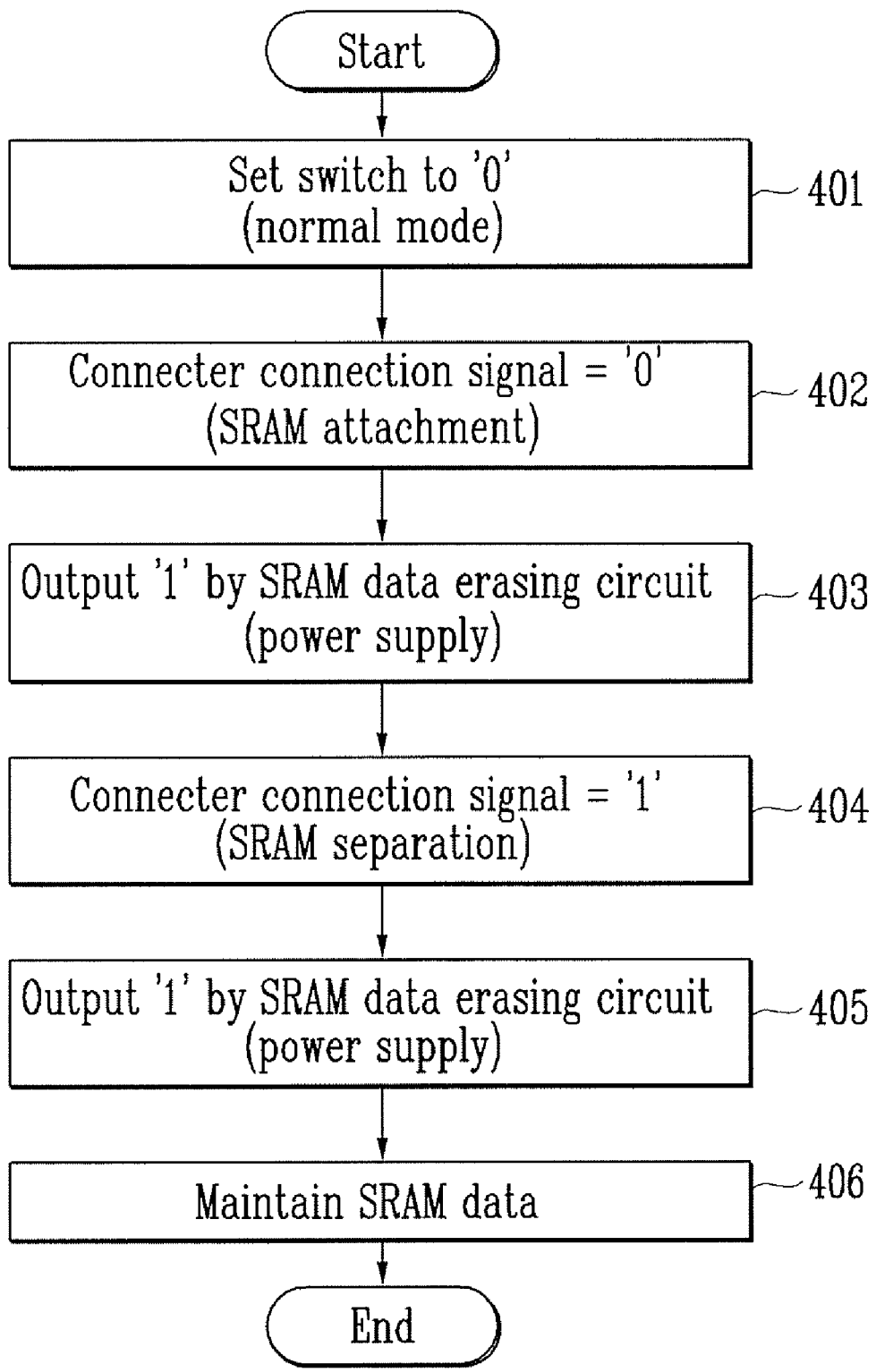

FIGS. 4A and 4B are flowcharts illustrating operation processes of an SRAM data erasing circuit of FIG. 3.

Referring to FIG. 4A, when a user sets a switch to '0' (S401), an SRAM data erasing circuit operates in normal mode. At this point, when an SRAM is attached to an SRAM connector, a connecter connection signal becomes '0' (S402), and the SRAM data erasing circuit outputs '1' according to the configuration of the circuit of FIG. 3 (S403). As described above, a logic circuit input/output value of '1' corresponds to the voltage of a power output terminal Vout of a power switching circuit. Thus, the SRAM data erasing circuit outputs '1' to indicate that electrical power output from the power output terminal Vout of the power switching circuit is supplied to a power input terminal VCC of the SRAM.

When the SRAM is separated, the connecter connection signal becomes '1' (S404), and the SRAM data erasing circuit operating in normal mode continuously outputs '1' according to the circuit configuration of FIG. 3 (S405). Thus, when the user sets the switch to '0', the SRAM data erasing circuit operates in normal mode allowing the SRAM to maintain data even though the SRAM is separated (S406).

Referring to FIG. 4B, when the user sets the switch to '1' (S411), the SRAM data erasing circuit operates in separation detection mode. At this point, when the SRAM is attached to the SRAM connector, the connecter connection signal becomes '0' (S412), and the SRAM data erasing circuit outputs '1' according to the circuit configuration of FIG. 3 (S413).

However, when the SRAM is separated, the connector connecting circuit becomes '1' (S414), and the SRAM data erasing circuit operating in separation detection mode outputs '0' according to the circuit configuration of FIG. 3 (S415). Accordingly, the power input terminal VCC of the SRAM is grounded and the data stored in the SRAM is completely erased (S416).

Therefore, to prevent leakage of the SRAM data, a user may set the switch of the SRAM data erasing circuit to '1' so that the data stored in the SRAM is completely erased when the SRAM is illegally separated from the system. Meanwhile, when the user separates the SRAM from the system, the switch of the SRAM data erasing circuit may be set to '0' in order to securely protect the data stored in the SRAM.

According to the present invention, it is possible to prevent illegal leakage of SRAM data by erasing data stored in the SRAM when the SRAM is illegally separated from the system according to the switch setting of the SRAM data erasing circuit.

Further, it is possible to embody a device for protecting SRAM data which is highly secure at low cost and effort, by adding a relatively simple SRAM data erasing circuit to a conventional power switching circuit.

While the invention has been shown and described with reference to certain exemplary embodiments thereof, it will be understood by those skilled in the art that various changes in form and details may be made therein without departing from the spirit and scope of the invention as defined by the appended claims.

What is claimed is:

1. A device for protecting data stored in an SRAM comprising:
 a power switching circuit for outputting electrical power supplied from an external power supply or a back-up battery power supply depending on whether the external power supply is supplying the electrical power or not; and
 an SRAM data erasing circuit for supplying the electrical power output from the power switching circuit to a power input terminal of the SRAM or grounding the power input terminal of the SRAM, in response to a connecter connection signal.

2. The device according to claim 1, wherein the connecter connection signal indicates whether the SRAM is attached to or separated from an SRAM connector connecting the SRAM with a system.

3. The device according to claim 1, wherein the power switching circuit transmits a first chip selection signal received from a central processing unit (CPU) to the SRAM, and the SRAM communicates data with the CPU in response to the first chip selection signal.

4. The device according to claim 3, wherein the SRAM data erasing circuit transmits a second chip selection signal to the SRAM in response to the connecter connection signal, and the SRAM communicates data with the CPU in response to the first and second chip selection signals.

5. The device according to claim 1, wherein the SRAM data erasing circuit supplies electrical power output from the power switching circuit to the power input terminal of the SRAM, or grounds the power input terminal of the SRAM according to setting of a switch included in the SRAM data erasing circuit and the connecter connection signal.

6. The device according to claim 5, wherein the SRAM data erasing circuit comprises the switch, a first RS latch, a second RS latch, a plurality of AND gates, and a plurality of inverters.

* * * * *